United States Patent
Azdasht

(10) Patent No.: US 9,649,711 B2
(45) Date of Patent: May 16, 2017

(54) METHOD AND DEVICE FOR ELECTRICALLY CONTACTING TERMINAL FACES OF TWO SUBSTRATES BY LASER SOLDERING USING A GASEOUS FLUX MEDIUM

(75) Inventor: Ghassem Azdasht, Berlin (DE)

(73) Assignee: PAC TECH-PACKAGING TECHNOLOGIES GMBH, Nauen (DE)

( * ) Notice: Subject to any disclaimer, the term of this patent is extended or adjusted under 35 U.S.C. 154(b) by 691 days.

(21) Appl. No.: 13/982,837

(22) PCT Filed: Jan. 30, 2012

(86) PCT No.: PCT/DE2012/000068
§ 371 (c)(1),
(2), (4) Date: Oct. 18, 2013

(87) PCT Pub. No.: WO2012/103868
PCT Pub. Date: Aug. 9, 2012

(65) Prior Publication Data
US 2014/0027418 A1   Jan. 30, 2014

(30) Foreign Application Priority Data
Feb. 2, 2011   (DE) .................. 10 2011 010 161

(51) Int. Cl.
*B23K 1/005* (2006.01)
*B23K 26/02* (2014.01)
(Continued)

(52) U.S. Cl.
CPC ............ *B23K 1/0056* (2013.01); *B23K 26/02* (2013.01); *B23K 35/362* (2013.01); *H01L 24/75* (2013.01);
(Continued)

(58) Field of Classification Search
CPC .... B23K 1/0056; B23K 26/02; B23K 35/362; B23K 2201/40; B23K 2201/42; B23K 26/57
See application file for complete search history.

(56) References Cited

U.S. PATENT DOCUMENTS 3,486,223 A   12/1969   Butera
4,278,867 A    7/1981   Tan
(Continued)

FOREIGN PATENT DOCUMENTS

CH       459316 A        7/1968
CN    101939832 A        1/2011
(Continued)

OTHER PUBLICATIONS

State Intellectual Property Office of People's Republic of China, First Office Action and Search Report, Application No. 201280007342.5, Aug. 28, 2015, 13 pages.
(Continued)

*Primary Examiner* — Geoffrey S Evans
(74) *Attorney, Agent, or Firm* — Quarles & Brady LLP

(57) ABSTRACT

A method for electrically contacting terminal faces of two substrates, such as a chip and a carrier substrate, includes two successive phases. In a first phase, the chip is positioned with its terminal faces against terminal faces of the substrate and laser energy is applied to the chip at the rear. In a second phase, a flux medium is applied and laser energy is applied to the rear of the chip to cause reflow. The device for performing the second phase of the method comprises a carrier table and a housing, which form a housing interior with a top side of the carrier table which receives the component arrangement, and a laser light source, which is oriented so that the laser radiation impinges on the rear side of the first substrate.

7 Claims, 1 Drawing Sheet

(51) Int. Cl.
- *B23K 35/362* (2006.01)
- *H01L 23/00* (2006.01)
- *H01L 25/065* (2006.01)
- *H01L 25/00* (2006.01)

(52) U.S. Cl.
CPC .............. *H01L 24/81* (2013.01); *H01L 24/16* (2013.01); *H01L 24/94* (2013.01); *H01L 25/0657* (2013.01); *H01L 25/50* (2013.01); *H01L 2224/16145* (2013.01); *H01L 2224/16221* (2013.01); *H01L 2224/7501* (2013.01); *H01L 2224/75101* (2013.01); *H01L 2224/75263* (2013.01); *H01L 2224/81065* (2013.01); *H01L 2224/8191* (2013.01); *H01L 2224/81191* (2013.01); *H01L 2224/81192* (2013.01); *H01L 2224/81193* (2013.01); *H01L 2224/81224* (2013.01); *H01L 2224/81815* (2013.01); *H01L 2224/81907* (2013.01); *H01L 2224/81986* (2013.01); *H01L 2225/06513* (2013.01); *H01L 2225/06517* (2013.01); *H01L 2924/014* (2013.01); *H01L 2924/12042* (2013.01)

(56) References Cited

U.S. PATENT DOCUMENTS

| | | | | |
|---|---|---|---|---|
| 5,227,604 | A * | 7/1993 | Freedman | B23K 1/0056 219/121.63 |
| 5,302,801 | A * | 4/1994 | Kanda | B23K 1/0056 219/121.63 |
| 5,829,125 | A * | 11/1998 | Fujimoto | B23K 1/0056 219/121.64 |
| 6,394,158 | B1 * | 5/2002 | Momeni | B23K 1/0056 219/121.64 |
| 2002/0130164 | A1 * | 9/2002 | Matsuki | B23K 1/008 228/206 |
| 2003/0217996 | A1 * | 11/2003 | Steur | B23K 1/0056 219/121.85 |
| 2005/0274704 | A1 * | 12/2005 | Oohashi | B23K 1/0056 219/121.85 |
| 2008/0268571 | A1 | 10/2008 | Kim | |
| 2009/0045444 | A1 * | 2/2009 | Huebner | H01L 24/48 257/296 |
| 2009/0155955 | A1 | 6/2009 | Liang | |
| 2010/0320258 | A1 * | 12/2010 | Sawada | B23K 1/0016 228/180.22 |
| 2011/0076801 | A1 | 3/2011 | Aoki et al. | |

FOREIGN PATENT DOCUMENTS

| | | | |
|---|---|---|---|
| DE | 4443822 | A1 * | 6/1996 |
| DE | 69401108 | T2 | 4/1997 |
| DE | 60219779 | T2 | 12/2007 |
| EP | 0 315 000 | A2 | 5/1989 |
| JP | 3-138090 | A * | 6/1991 |
| JP | 6-77638 | A * | 3/1994 |
| JP | H06170521 | A | 6/1994 |
| JP | H06262743 | A | 9/1994 |
| JP | H0774209 | A | 3/1995 |
| JP | 2000174059 | A | 6/2000 |
| JP | 2001-156436 | A * | 6/2001 |
| JP | 2002210555 | A | 7/2002 |
| JP | 2002361472 | A | 12/2002 |
| JP | 2005294823 | A | 10/2005 |
| JP | 2011003765 | A | 1/2011 |
| WO | 2005005088 | A2 | 1/2005 |

OTHER PUBLICATIONS

Japan Patent Office, Notice of Grounds of Rejection, Application No. 2013-552102, Sep. 1, 2015, 14 pages.

The International Search Report as mailed on Jul. 26, 2012 for International Application No. PCT/DE2012/000068.

"Loten," Wikipedia, Jan. 24, 2011, XP55032987, Internet URL: URL:http://de.wikipedia.org/w/index.php?title=L%C3%B6ten &oldid=84357195 [retrieved on Jul. 17, 2012].

The International International Preliminary Report on Patentability as issued on Aug. 6, 2013 for International Application No. PCT/DE2012/000068.

* cited by examiner

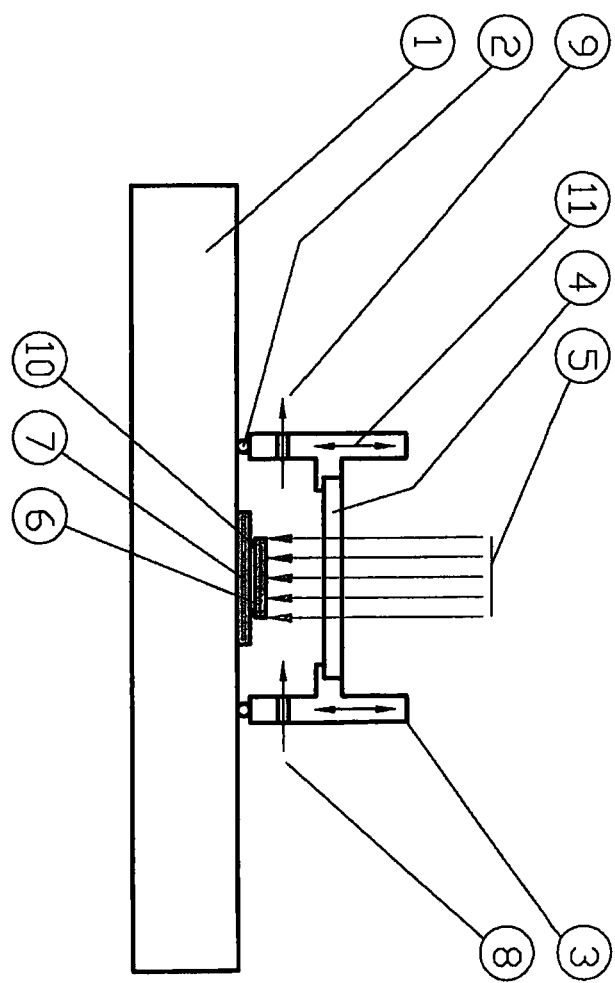

METHOD AND DEVICE FOR ELECTRICALLY CONTACTING TERMINAL FACES OF TWO SUBSTRATES BY LASER SOLDERING USING A GASEOUS FLUX MEDIUM

CROSS-REFERENCE TO RELATED APPLICATIONS

This application represents the national stage entry of PCT International Application No. PCT/DE2012/000068 on Jan. 30, 2012 and claims the benefit of German Patent Application No. 10 2011 010 161.6 filed Feb. 2, 2011. The contents of both of these applications are hereby incorporated by reference as if set forth in their entirety herein.

The present invention relates to a method for electrically contacting terminal faces of two substrates, wherein the first substrate with its terminal faces facing the second substrate is electrically and mechanically connected directly to the terminal faces of the second substrate and the terminal faces of the first substrate are provided with a soldering agent coating. For forming a chip module, in particular, the first substrate can be a chip and the second substrate can be a carrier substrate, wherein the chip is contacted face down with its chip terminal faces against the substrate terminal faces.

Furthermore, the invention relates to a device for performing a second phase of the method according to the invention.

From the generic state of the art, methods for the direct mounting of semiconductor chips on carrier substrates are known. There are, for example, methods in which the unpackaged chip is fixed directly on the carrier substrate or on a printed circuit board with its terminal faces facing the carrier substrate and with soldering agents (solder balls) previously applied to the terminal faces of the chip. For this purpose, the soldering agent coating is re-melted during reflow soldering in a soldering furnace and forms a connection with the terminal faces of the carrier substrate. Methods of this type are highly complex in terms of their process flow as well as regarding the required apparatuses.

Therefore, it is the object of the present invention to propose a method and a device for the implementation thereof which technically simplify the process of electrically contacting terminal faces of two substrates, in particular of semiconductor components with carrier substrates, and thus to improve economic efficiency.

The method according to the invention takes place in two successive phases, wherein, in phase I, the chip is positioned with its terminal faces against the terminal faces of the substrate, and the chip terminal faces and/or the substrate terminal faces are provided with a soldering agent coating. In phase I, laser energy is applied to the chip at the rear in such a manner that the soldering agent is melted or partially melted at least to such an extent so as to enable a fixation of the chip on the substrate, wherein, simultaneously, a leveling or a uniform flattening of the soldering agent coatings provided on the chip terminal faces or on the substrate terminal faces takes place so that a contact is formed between all chip terminal faces and substrate terminal faces.

Following phase I, the component arrangement formed by the chip and the substrate is disposed in a housing, which is realized in such a manner that during a reflow of the solder material coating, a flux medium is applied to the component arrangement, the flux medium being in particular gaseous and preferably consisting of a mixture of nitrogen and formic acid. It is particularly advantageous if the housing is formed such that a flowing of the medium through the housing interior takes place, wherein, simultaneously with the application, a reflow takes place due to the application of laser energy to the chip at the rear, similarly to the previously described phase I.

Following the application of the flux medium, which enables in particular a breaking of an oxide layer which may have formed on the soldering agent coating in phase I, a process of rinsing the housing interior takes place, for which exclusively a protective gas is preferably utilized.

Further advantageous implementation features result from the following description and the drawing, which illustrates a preferred embodiment of the invention using an example.

The FIGURE shows a schematic illustration of the device according to the invention.

In the FIGURE, a device for implementing the method is illustrated during phase II after the afore-described fixation of the chip on the substrate has taken place in phase I, which is not illustrated here. Once phase I has been completed, the component arrangement is brought into the position illustrated in the FIGURE, in which position it is located below the housing 3, and then the housing 3 is lowered onto the component arrangement as illustrated in the FIGURE.

In phase II, the component arrangement formed by the chip 6 and the substrate 7 is located in the interior of a housing 3, which is sealed against the outside by a seal 2 closing with the carrier table 1. In a wall otherwise substantially gas-tight against the environment, the housing 3 has an inlet opening 8 and an outlet opening 9, which enable a flow-through, respectively a rinsing or flooding of the housing interior with a gaseous medium. The housing wall, which is arranged substantially parallel to a rear side of the chip 6, is formed by a glass plate or a transparent plate, which enables an application of laser energy 5 to the chip at the rear, the laser radiation being focused corresponding to the dimensions of the rear side of the chip 6 so as to avoid a direct introduction of heat or energy into the substrate 7. The application of laser energy 5 to the chip 6 at the rear causes a reflow of the soldering agent coating 10 arranged between the chip terminal faces and the substrate terminal faces while a flux medium is flowing through the housing interior, the flux medium in the present case being formed by a mixture of nitrogen and formic acid. For forming said gas mixture, for example, a nitrogen flow can be guided over the surface of a formic acid bath outside of the housing 3 so that the vapor of the formic acid, which is carried along, blends with the nitrogen before flowing into the housing 3. After the reflow has taken place, meaning in particular after laser energy has been applied to the rear side of the chip, a preferably pure protective gas flow flows through or rinses the interior of the housing 3, a nitrogen flow being preferably used here, so as to avoid flux medium depositions, meaning in particular depositions of formic acid, on the component arrangement 6/7.

Instead of the formic acid mentioned as an example here, any gaseous flux medium which has comparable effects can basically be used.

In deviation from the illustration of the component arrangement exemplarily illustrated in the FIGURE as a combination of a chip 6 and a substrate 7, it is also possible to implement the method according to the invention on a wafer level, i.e. for connecting two wafers.

Furthermore, in deviation from the chosen illustration, it is also possible to not only connect a chip and a substrate or to melt soldering agent coatings or deposits arranged between the substrate terminal faces and the chip terminal faces in a reflow process, but also to connect stacked arrangements of chips, comprising a plurality of chips arranged one on top of the other, to a substrate.

The invention claimed is:

1. A method for electrically contacting terminal faces of two substrates, said method comprising:
    providing a first substrate with terminal faces facing a second substrate, wherein the terminal faces of the first substrate are provided with a soldering agent;
    positioning the terminal faces of the first substrate against terminal faces of the second substrate;
    applying laser energy to a rear of the first substrate in such a manner that the soldering agent is melted at least to such an extent so as to enable a mechanical fixation of the first substrate on the second substrate and an electrical contacting of the terminal faces facing each other;
    applying a flux medium, in a housing interior, to a component arrangement formed by the first and second substrates;
    simultaneously with the step of applying the flux medium, re-melting the soldering agent using laser energy applied to the rear of the first substrate; and
    subsequently rinsing the housing interior.

2. The method according to claim 1, in which the flux medium is in a gaseous state.

3. The method according to claim 2, in which the gaseous flux medium consists of a mixture of nitrogen and formic acid.

4. The method according to claim 3, in which for forming the gaseous flux medium, outside of the housing interior, a nitrogen flow is guided over a surface of a formic acid bath so that the vapors of the formic acid, which are carried along, blend with the nitrogen before being applied to the component arrangement.

5. The method according to claim 1, in which the rinsing is performed with a pure protective gas flow.

6. The method according to claim 5, in which the pure protective gas flow is a nitrogen flow.

7. The method according to claim 1, in which only the terminal faces of the first substrate are provided with a soldering agent.

* * * * *